United States Patent [19]

Ohta et al.

[11] Patent Number: 5,738,765

[45] Date of Patent: Apr. 14, 1998

[54] MAGNETO-OPTIC MEMORY DEVICE

[75] Inventors: Kenji Ohta, Yao; Akira Takahashi; Hiroyuki Katayama, both of Nara; Junji Hirokane, Tenri; Hideyoshi Yamaoka, Matsubara, all of Japan

[73] Assignee: Sharp Kabushiki Kaisha, Osaka, Japan

[21] Appl. No.: 443,760

[22] Filed: May 18, 1995

Related U.S. Application Data

[62] Division of Ser. No. 55,911, Apr. 30, 1993, abandoned, which is a continuation of Ser. No. 730,528, Jul. 15, 1991, abandoned, which is a continuation of Ser. No. 218,259, Jul. 13, 1988, abandoned, which is a division of Ser. No. 68,775, Jun. 29, 1987, abandoned, which is a continuation of Ser. No. 697,027, Jan. 31, 1985, abandoned, which is a continuation of Ser. No. 489,889, Apr. 29, 1983, abandoned.

[30] Foreign Application Priority Data

| Dec. 15, 1982 | [JP] | Japan | 57-220999 |
| Mar. 17, 1983 | [JP] | Japan | 58-45487 |
| Mar. 17, 1983 | [JP] | Japan | 58-45488 |

[51] Int. Cl.$^6$ ............................................. C23C 14/00

[52] U.S. Cl. ........................ 204/192.23; 204/192.26; 204/192.2; 204/192.22; 427/127; 427/128; 428/694 ML; 428/694 SC; 428/294 DE; 428/294 MT; 428/694 NF; 428/694 RL; 428/900

[58] Field of Search ................ 428/694 ML, 694 SC, 428/694 DE, 694 MT, 694 NF, 694 RL, 900; 204/192.2, 192.23, 192.26, 192.22; 427/127, 128

[56] References Cited

U.S. PATENT DOCUMENTS

| 3,421,936 | 1/1969 | Vogel, Jr. | 428/448 |
| 3,472,575 | 10/1969 | Hunt | 365/122 |
| 3,600,218 | 8/1971 | Pennebaker | 427/571 |
| 4,042,341 | 8/1977 | Smeggil | 428/678 |
| 4,170,689 | 10/1979 | Katsui et al. | 428/433 |
| 4,277,540 | 7/1981 | Aine | 428/627 |
| 4,322,839 | 3/1982 | Yamashita et al. | 369/122 |
| 4,390,600 | 6/1983 | Ohta et al. | 428/621 |

(List continued on next page.)

FOREIGN PATENT DOCUMENTS

| 0023809 | 2/1981 | European Pat. Off. . |
| 0049821 | 4/1982 | European Pat. Off. . |
| 0062975 | 10/1982 | European Pat. Off. . |
| 0233034 | 8/1987 | European Pat. Off. . |
| 2485241 | 12/1981 | France . |
| 2303520 | 1/1974 | Germany . |
| 2931825 | 2/1980 | Germany . |
| 3110583 | 1/1982 | Germany . |
| 3124573 | 3/1982 | Germany . |
| 3200661 | 3/1985 | Germany . |
| 074843 | 6/1981 | Japan . |
| 150952 | 6/1981 | Japan . |

(List continued on next page.)

OTHER PUBLICATIONS

Cuomo et al, "Antireflection Coatings . . . ." IBM Tech. Dis. Bull., vol. 16, No. 5, Oct. 1973.

Mansuripur et al, "Optimum Disk Structures . . . , " Ill. Trans. on Magnetics, vol. MAG-18, Nov. 6, 1982.

Sinha et al., J. Electrochem. Soc., Apr. 1978, pp. 601–608.

Chu, et al., J. Electrochem. Soc., Jul. 1967, pp. 717–722.

(List continued on next page.)

Primary Examiner—Leszek Kiliman

[57] ABSTRACT

A magneto-optic memory device includes a transparent dielectric film of a non-oxygen containing nitride material deposited by sputtering on a substrate such as glass, a rare-earth/transition metal alloy recording medium deposited by sputtering on the dielectric film and a reflecting film deposited over the recording medium with or without an intervening transparent dielectric film of non-oxygen containing nitride material. This arrangement prevents the recording medium from being oxidized, and stablizes coercive force characteristics and information recording characteristics of the recording medium.

39 Claims, 4 Drawing Sheets

U.S. PATENT DOCUMENTS

| | | | |
|---|---|---|---|
| 4,405,993 | 9/1983 | Kahn et al. | 365/108 |
| 4,414,650 | 11/1983 | Ohta et al. | 365/122 |
| 4,417,290 | 11/1983 | Tanaka | 360/131 |
| 4,430,659 | 2/1984 | Maffitt et al. | 346/135.1 |
| 4,466,035 | 8/1984 | Connell et al. | 360/114 |
| 4,489,139 | 12/1984 | Ohta et al. | 428/621 |
| 4,499,178 | 2/1985 | Wada et al. | 430/270.12 |
| 4,610,912 | 9/1986 | Takahashi et al. | 428/213 |
| 5,041,341 | 8/1991 | Shindo | 428/626 |

FOREIGN PATENT DOCUMENTS

| | | |
|---|---|---|
| 56-71834 | 6/1981 | Japan . |
| 57-74854 | 5/1982 | Japan . |
| 57-32413 | 7/1982 | Japan . |
| 006541 | 1/1983 | Japan . |
| 59-38779 | 3/1984 | Japan . |
| 459802 | 2/1975 | U.S.S.R. . |
| 2081537 | 2/1982 | United Kingdom . |

OTHER PUBLICATIONS

Cuomo et al., IBM Technical Disclosure Bulletin, vol. 16, No. 5, Oct. 1973.

Allen et al., J. Appl. Phys. 53(3), Mar. 1982, pp. 2353–2355.

Katayama et al., J. Appl. Phys., vol. 49, No. 3, Mar. 1978, pp. 1759–1761.

Pliskin, J. Vac. Sci. Technol. vol. 14, No. 5, Sep./Oct. 1978, pp. 1064–1081.

MAGNETO-OPTIC MEMORY DEVICE

This application is a divisional of application Ser. No. 08/055,911, filed on Apr. 30, 1993, which was a continuation of Ser. No. 07/730,528 filed on Jul. 15, 1991, which was a continuation of Ser. No. 07/218,259 filed Jul. 13, 1988, which was a divisional of Ser. No. 07/068,775 filed Jun. 29, 1987, which was a continuation of Ser. No. 06/697,027 filed on Jan. 31, 1985, which was a continuation of Ser. No. 06/489,889 filed Apr. 29, 1983; the entire contents of which are hereby incorporated by reference, all now abandoned.

BACKGROUND OF THE INVENTION

The present invention relates to a magneto-optic memory device capable of recording, reproducing and erasing information thereon with the use of light waves such as laser beams.

Recent years have seen various efforts to develop optical memory devices since they are expected to be a good memory candidate because of their higher storage density and capacity. Particularly, much attention has been given to those optical memory devices in which additional information can be recorded by the user (the recorded information is not erasable) and those optical memory devices in which information can be recorded and erased by the user. Various recording mediums and optical memory systems have been proposed for such memory arrangements. The known recording mediums for the former optical memory devices include TeOx, TeSe, TeC, etc. Among the known recording mediums for the latter optical memory devices are GdTbFe, GdTbDyFe, TbFe, etc. Most of such recording mediums are poor in their resistance to corrosion which have heretofore been made to solve this problem.

Difficulties experienced with optical memory mediums when the latter are corroded or oxdized will be described. The Inventors have studied optical memory devices (so-called "magneto-optic memory devices") having a memory medium made of a rare earth transition metal alloy and in which information can be recorded and erased by the user. FIG. 1 shows in detail the arrangement of one such conventional magneto-optic memory device. The illustrated magneto-optic memory device includes a glass substrate 1, a thin film 2 (recording medium) of amorphous alloy of GdTbFe having a thickness in the range of from 100 to 200 Å deposited on the glass substrate 1 by sputtering, a film 3 of $SiO_2$ (transparent dielectric film) having a thickness ranging from 300 to 400 Å deposited on the thin film 2 by sputtering, and a film 4 of Cu (reflecting film) having a thickness ranging from 300 to 500 Å deposited on the film 3 by sputtering.

The magneto-optic memory device of the above construction has been measured by an optical system shown in FIG. 2 for the degree of dependency of a magneto-optic rotational angle on a magnetic field. As shown in FIG. 2, a monochromatic light beam such as a laser beam emitted from a light source 5 is changed by a polarizer 6 into a linearly polarized light beam, which passes through a half-mirror 7 and falls on a magneto-optic memory device 8 arranged perpendicularly to its surface. The light beam enters the recording medium 2 of the magneto-optic memory device 8 through the glass substrate 1. A light beam reflected from the magneto-optic memory device 8 is deflected by the half-mirror 7 into a light detector 9 which detects an angle at which the plane of polarization of light is rotated. The magnetic field is rendered variable by an electromagnet 10.

FIG. 3 illustrates a measurement of the degree of dependency of the magneto-optic rotational angle on the magnetic field as measured by the illustrated optical system. The graph of FIG. 3 has a horizontal axis indicating the intensity of a magnetic field H and a vertical axis indicating a Kerr rotational angle θk. Designated at Hc is the value of a coercive force (magnetic force at which magnetization is inverted). The value of the coercive force is quite important in the magneto-optic memory device. If the coercive force is too large, an excessive amount of heat would be required for recording information, and no information could be recorded with a small-size laser such as a semiconductor laser. The magnetic field applied to record information would have to be excessively great. Conversely, if the coercive force is too small the, recorded information would tend to be erased by a relatively small increase in the external temperature or the external magnetic field. As the coercive force of the recording medium varies with time, the values of the temperature and magnetic field necessary for information recording also vary in general. Therefore, it is desirable to keep the coercive force constant.

When the recording medium of the above magneto-optic memory device is made of an alloy of rare earth elements and transition metals, the coercive force of the recording medium varies widely with the composition ratio of rare earth elements. FIG. 4 is a graph showing the relationship between the composition ratio of rare earth elements (Gd, Tb) and the coercive force of the thin film of an amorphous alloy of GdTbFe. The graph has a horizontal axis indicative of an area ratio of the rare earth elements placed on an iron target upon sputtering. The elements Gd, and Tb are equal in their amounts. FIG. 4 shows that the percentage of the rare earth elements in the thin film of an amorphous alloy of GdTbFe is about 26.3% at a compensation point of room temperature. The magneto-optic effect (the Kerr rotational angle as shown in FIG. 3) is changed at the point where the percentage of the rare earth elements is about 26.3%. When the percentage of the rare earth elements is greater than 26.3%, that is, the rare earth elements are relatively rich, the magneto-optic effect is progressively greater at the left of the respective curve in FIG. 4. When the percentage of the rare earth elements is smaller than 26.3%, that is, the iron is relatively rich, the magneto-optic effect is progressively greater at the right of the respective curve in FIG. 4.

Applicants have prepared a magneto-optic memory device having a recording medium of a composition as shown at point A in FIG. 4. The prepared magneto-optic memory device has been left at 70° C. for 42 hours to study its reliability. The recording medium changes to a recording medium having a composition as shown at point B where the coercive force Hc is 3K Oe, in a pattern as indicated by the arrowheads. This is considered to be brought about by the fact that the rare earth elements (Gd, Tb) in the film of the GdTbFe amorphous alloy are oxidized by oxygen separated from the $SiO_2$ film adjacent to the film of GdTbFe amorphous alloy, and the oxidized amount of rare earth elements no longer accounts for the magnetic characteristics.

As described above, the conventional magneto-optic memory devices fail to prevent a time-dependent change in the recording medium due to oxidization, and hence are incapable of ensuring a constant coercive force.

Accordingly, the conventional magneto-optic memory devices cannot record information in a stable manner.

SUMMARY OF THE INVENTION

With the foregoing difficulties in mind, it is an object of the present invention to provide an improved magneto-optic memory device having a recording medium protected from oxidizataion for a stabilized coercive force and stable information recording characteristics.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, a magneto-optic memory device according to an embodiment of the present invention comprises a substrate, a thin film recording medium of a rare earth transition metal alloy, a film of aluminum nitride serving as a transparent dielectric film with no oxygen content, and a reflecting film, all layered in turn. The reflecting film is made of stainless steel.

The above objects can also be achieved by a magneto-optic memory device according to another embodiment of the invention, comprising a substrate, a thin film of a rare earth transition metal alloy, a film of transparent dielectric film composed of a film of nitride such as of aluminum nitride or silicon nitride having no oxygen content, and a reflecting film of titanium or titanium nitride, all layered in turn.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
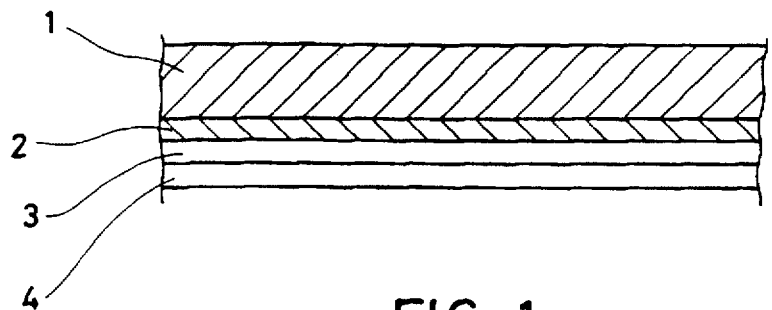
FIG. 1 is a fragmentary cross-sectional view of a conventional magneto-optic memory device.
Figure 2:
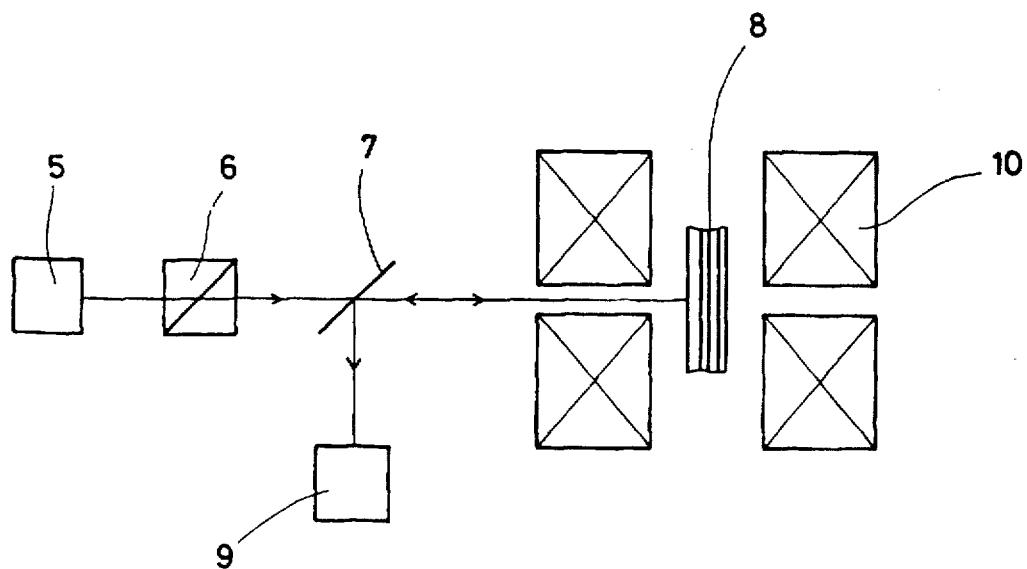
FIG. 2 is a schematic view of a measurement optical system.
Figure 3:
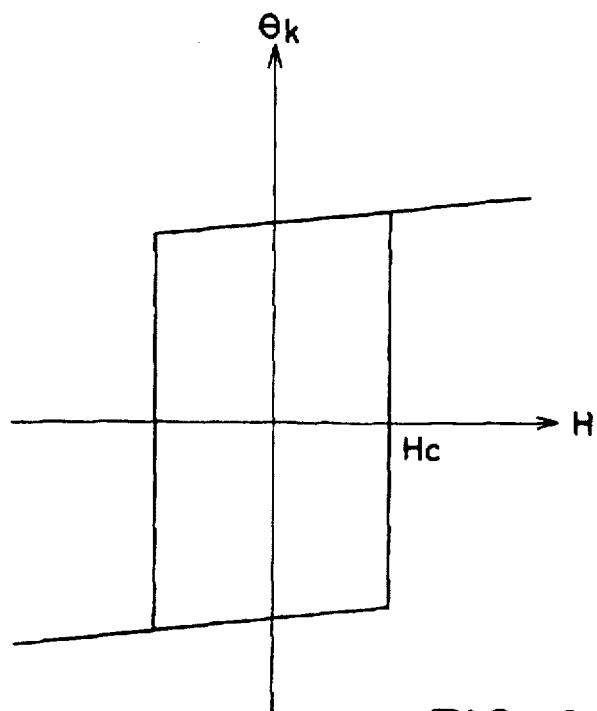
FIG. 3 is a graph showing a degree of dependency of the magneto-optic rotational angle on a magnetic field.
Figure 4:
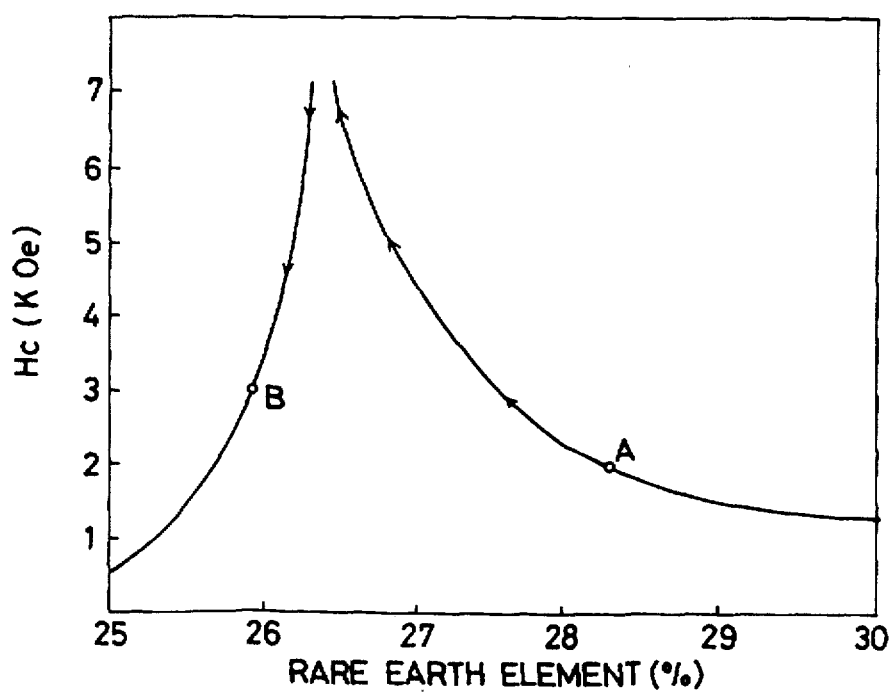
FIG. 4 is a graph showing the relationship between a composition ratio of rare earth elements in a thin film of GdTbFe amorphous alloy and the coercive force of the film.
Figure 5:
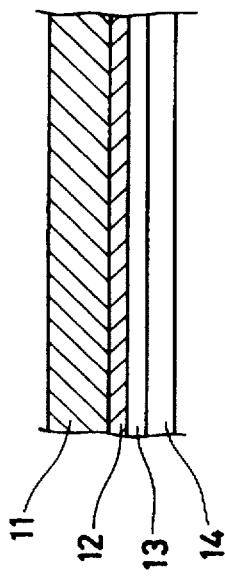
FIG. 5 is a fragmentary cross-sectional view of a magneto-optic memory device according to an embodiment of the present invention.

FIG. 5 shows in fragmentary cross section a magneto-optic memory device construction according to an embodiment of the present invention. The magneto-optic memory device includes a thin film 12 (serving as a recording medium) made of GdTbFe amorphous alloy having a thickness in the range of from about 150 to about 200 Å deposited on a glass substrate 11 by sputtering. On the GdTbFe film 12, there is deposited a film 13 (serving as a transparent dielectric film) made AlN (Aluminum nitride) having a thickness ranging from about 400 to about 500 Å by reactive sputtering of aluminum in nitrogen gas. A film 14 serving as a reflecting film of stainless steel (such as SUS 304) having a thickness ranging from about 500 to about 600 Å is deposited on the AlN film 13 by sputtering.

Figure 6:
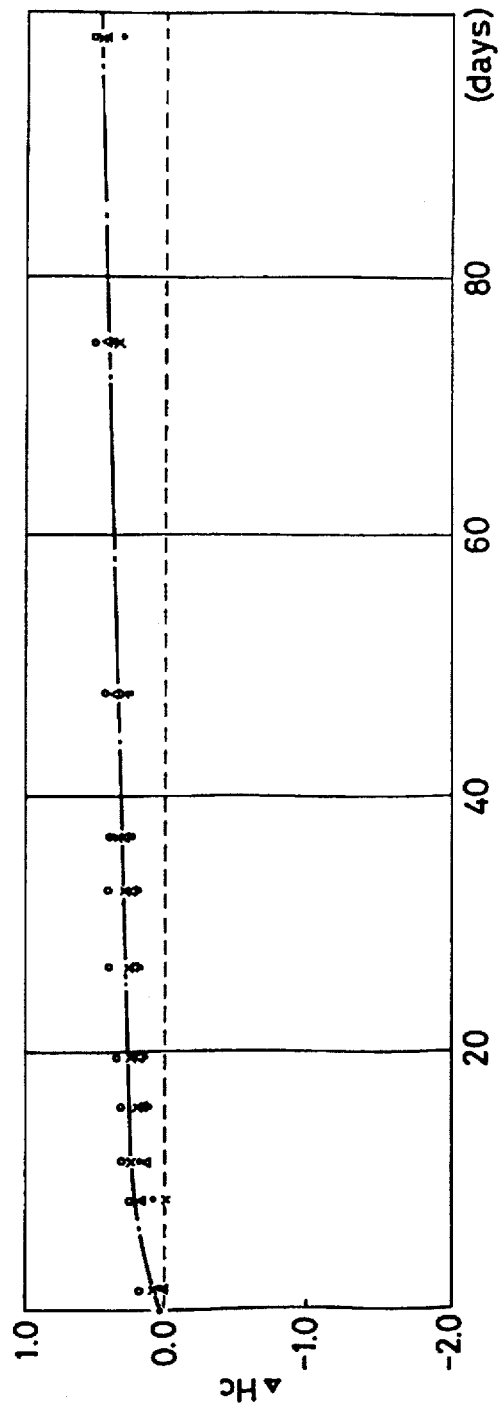
FIG. 6 is a graph showing the result of a storage test on the magneto-optic memory device illustrated in FIG. 5.

Applicants prepared four magneto-optic memory devices of the foregoing construction, and conducted a storage test on the memory devices at a temperature of 70° C. FIG. 6 illustrates the result of such a storage test, in which test results for the four memory devices are indicated by the marks ○, x, •, △, respectively. The mark △ is superimposed on the mark • in many instances. As shown in FIG. 6, the coercive force becomes slightly larger by about 0.4 kOe than an initial coercive force (in the range of from about 1.8 to about 2.2 kOe) after about 100 days of the storage test on the magneto-optic memory device. The increase in the coercive force is extremely small as compared with that in magneto-optic memory devices of a conventional structure. This is because the transparent dielectric film of aluminum nitride has no oxygen content in itself while conventional transparent dielectric films of $SiO_2$ have an oxygen content. Stated otherwise, when the transparent dielectic film is formed by way of reactive sputtering in a nitrogen gas using an aluminum target, there is no tendency for oxygen to enter the recording medium at the time the film is deposited. From this standpoint, the transparent dielectric film may be made of other materials with no oxygen content such as $MgF_2$, ZnS, $CeF_3$, $AlF_3 \cdot 3NaF$.

However, most of the targets comprising these materials are porous, so that in case these materials are employed to fabricate the transparent dielectric film by conventional sputtering, oxygen and water for penetrating into the pores in the materials are liable to oxidize the recording medium during sputtering. To the contrary, where the transparent dielectric film is fabricated of aluminum nitride, the target used is made of aluminum only and is advantageous from the standpoint of material savings. The aluminum target is not porous and hence does not trap therein oxygen and water. Due to the structural features, aluminum nitride can form highly tight films which render themselves impermeable to oxygen and water, a property which also prevents the recording medium from being oxidized.

The film 14 of stainless steel is highly advantageous for use as a reflecting film in the magneto-optic memory device. The advantages of the reflecting film of stainless steel will be described below.

(1) Corrosion resistance:

As is well known, stainless steel is excellent in its corrosion resistance capability. For example, no pinhole will formed in a reflecting film of stainless steel when a fingerprint is put on the film, while a minute pinpole will be form in a reflecting film of Cu at a later time after a fingerprint is impressed on the film. (In an experiment, no pinhole was formed in a reflecting film of Ni.) The excellent corrosion resistivity of stainless steel can contribute to the corrosion resistance capability of the recording medium.

(2) Thermal conductivity:

Stainless steel has a poor thermal conductivity as compared with Cu, Au, Ag, and Al. For this reason, when the recording medium is heated by a laser beam irradiated thereon, the heat conductivity is reduced and the laser beam energy required for information recording is reduced. Aluminum nitride of which the transparent dielectric film is made has relatively good thermal conductivity and hence allows much heat to escape. Where the transparent dielectric film is formed of aluminum nitride, therefore, the reflecting film of stainless steel is particularly suitable for use in combination therewith.

(3) Easy film formation:

Since stainless steel is easily capable of sputtering, and since a film can be fabricated thereof with ease, this is advantageous for fabrication purposes.

While in the foregoing embodiment the substrate 11 is formed of glass, it may be in the form of a transparent substrate of polycarbonate, acrylic resin, or epoxy resin, for example. The recording medium may be made of TeOx ($0 \leq x < 1$), TeC, TeSe or the like with Te being a main component, or of MnBi, MnBiCu, MnB or the like. The dielectric film may be formed of silicon nitride instead of aluminum nitride. The reflecting film 14 may be formed of Ni, Ti, or TiN instead of stainless steel. In addition, a transparent dielectric film having no oxygen content may be disposed between the substrate and the recording medium film.

Figure 7:
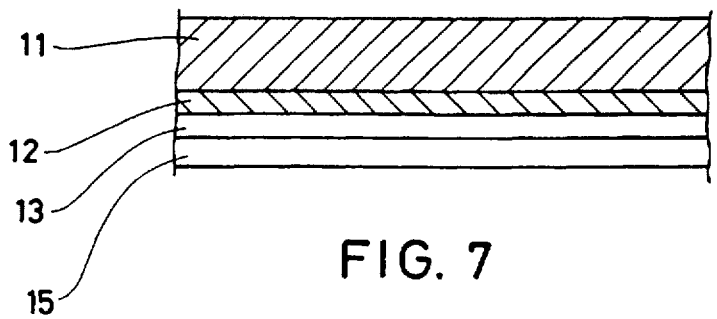
FIG. 7 is a fragmentary cross-sectional view of a magneto-optic memory device according to another embodiment of the invention.

FIG. 7 is illustrative, in fragmentary cross section, of a magneto-optic memory device according to another embodiment of the present invention. The illustrated magneto-optic memory device includes a thin film 12 (serving as a recording medium) made of GdTbFe amorphous alloy having a thickness in the range of from about 150 to about 200 Å deposited on a glass substrate 11 by sputtering. On the GdTbFe film 12, there is deposited a film 13 (serving as a transparent dielectric film) made of AlN (aluminum nitride) having a thickness ranging from about 400 to about 500 Å by reactive sputtering of aluminum in a nitrogen gas. A film 15 (serving as a reflecting film) of Ti (titanium) or TiN (titanium nitride) is deposited on the AlN film 13 by sputtering.

The reflecting film of titanium or titanium nitride exhibits the following advantages:

Where the dielectric film is made of aluminum nitride, it is quite difficult to cover the dielectric film with a conventional reflecting film of Cu, Al, or the like with a high reflectivity in a laser wavelength range (about 800 nm). This difficulty is considered to be due to the fact that the effect of nitrogen in the aluminum nitride on Cu or Al is not negligible. To the contrary, the reflecting film of titanium or titanim nitride can easily be deposited on the transparent dielectric film of aluminum nitride with a high reflectivity in the laser wavelength range. This allows a large amount of light to be reflected from the reflecting film, resulting in an improved reproduced signal. Another advantage is that in case the reflecting film is deposited of titanium or titanium nitride by way of sputtering, the target used is made of Ti, which is relatively less costly and easily available.

The magneto-optic memory device of the present invention is not limited to the construction of the illustrated embodiment. More specifically, a transparent dielectric film of aluminum nitride may be interposed between the glass substrate 11 and the thin film 12 of a GdTbFe amorphous alloy, so that the thin film can be sandwiched between the transparent dielectric films of aluminum nitride. The glass substrate may be replaced with a substrate of polycarbonate, acrylic resin, epoxy resin or the like.

Figure 8:
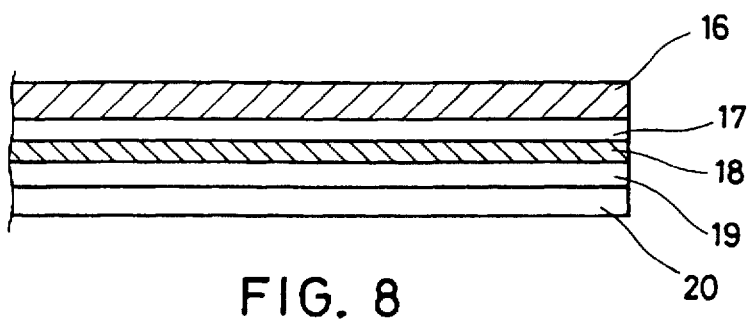
FIG. 8 is a fragmentary cross-sectional view of a magneto-optic memory device according to still another embodiment of the invention.
Figure 9:
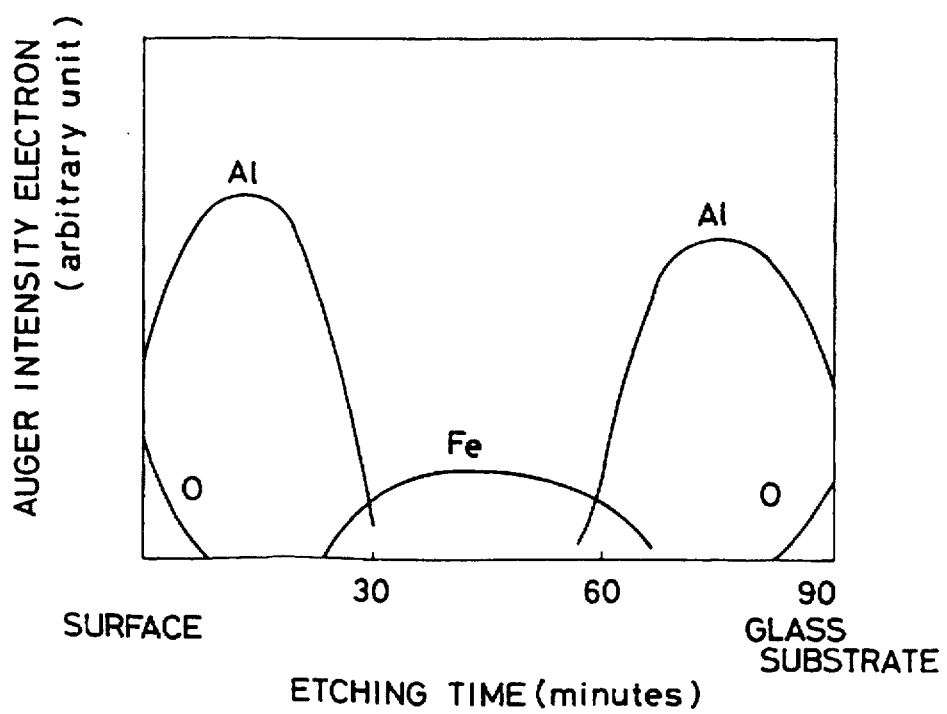
FIG. 9 is a graph showing the result of an Auger electron spectroscopy of the magneto-optic memory device shown in FIG. 8.

FIG. 8 shows a magneto-optical memory device according to still another embodiment of the present invention. A film 17 of aluminum nitride (serving as a first transparent dielectric film) is deposited on a transparent substrate 16 made of glass, polycarbonate, acrylic resin or the like. On the film 17, there is formed a thin film 18 of a rare earth transition metal alloy such as GdTbFe, TbDyFe, GdTbDyFe, TbFe, GdFeCo, GdCo, or such alloys with a content of Sn, Zn, Si, Bi, B or the like. In addition, a transparent film 19 of aluminum nitride (serving as a second transparent dielectric film) is deposited on the thin film 18. A reflecting film 20 of Cu , Ag, Al, Au or the like is formed on the transparent film 19. The magneto-optic memory device of the above structure was subjected to an Auger electron spectroscopy. FIG. 9 shows the result of such an Auger electron spectroscopy, indicating Auger electron intensities in Al, Fe, and O of the three films, that is, the first film of aluminum nitride, the film of GdTbFe, and the second film of aluminum nitride. As illustrated, no oxygen is contained in the GdTbFe film, and a slight amount of oxygen is present in the interface between the surface and the film aluminum nitride and the interface between the film of aluminum nitride and the transparent substrate. This indicates that there is oxygen entering into the film of aluminum nitride from the exterior and into the film of aluminum nitride from the glass substrate after the films have been fabricated. This experimental result shows that the sandwich structure of a thin film 18 of a rare earth transition metal alloy between the films of aluminum nitride is effective to prevent the thin film 18 from being oxidized during the process of fabricating the films.

Instead of aluminum nitride, the transparent dielectric films may be formed of $Si_3N_4$ by way of reactive sputtering in a nitrogen gas using an Si target. The transparent dielectric films may be formed of $MgF_2$, ZnS, $CeF_3 \cdot 3NaF$ by vacuum deposition.

The first transparent dielectric film in the above magneto-optical memory device should have a thickness of at least 100 Å for the reason that when the first transparent dielectric film is deposited on the glass substrate, oxygen in the glass substrate enters the first transparent dielectric film to a depth of about 50 Å. If the thickness of the first transparent dielectric film were smaller than 100 Å, it would be possible for oxygen to find its way into the thin film of rare earth transition metal alloy when the latter is being sputtered on the first transparent dielectric film. The second transparent dielectric film is deposited mainly for the purposes of increasing the magneto-optic rotational angle and to improve the quality of reproduced signals. In the event of reproduced signals already available of sufficent quality, the second transparent dielectric film may be dispensed with, and a reflecting film of Cu, Ag, Al, Au or the like may be deposited directly on the thin film 18 of rare earth transition metal alloy. The reflecting film 20 in the magneto-optic memory device of FIG. 8 may be covered with a film of an easily oxidizable metal such as Ti, Mg, a rare earth metal (Gd, Tb, Dy, Ho, Y, etc), an alloy of a rare earth element and transition metal (GdTbFe, TbDyFe, GdCo, GdTbDyFe, etc) to provide a complete device of a construction which prevents entry of oxygen from the exterior.

The film of aluminum nitride serving as a transparent dielectric film may be formed by deposition or other fabrication processes. The thicknesses of the films in the magneto-optic memory device are not limited to those described above in the illustrated embodiments.

The invention being thus described, it will be obvious that the same may be varied in many ways. Such variations are not to be regarded as a departure from the spirit and scope if the invention, and all such modifications are intended to included within the scope of the following claims.

What is claimed is:

1. A method of making an oxidation resistant magneto-optical memory device with enhanced stability of coercive force and information recording characteristics comprising the steps of:

providing a substrate for supporting a film of magneto-optic recording medium;

forming a first transparent dielectric film which itself is free of oxygen on said substrate;

forming a film of rare earth-transition metal amorphous alloy recording medium on said first dielectric film;

forming a second transparent dielectric film which itself is free of oxygen on said film of recording medium; and forming a reflective film on said second film of a material selected from the group consisting of stainless steel, Ti, and TiN;

wherein the forming of said first dielectric film on said substrate is prior to forming said film of recording medium to preclude selective oxidation of the rare earth portion of said recording medium by said substrate.

2. The method of claim 1, wherein said transparent dielectric films are formed by reactive sputtering of either Si (silicon) or Al (aluminum) in $N_2$ (nitrogen) gas.

3. The method of claim 1, wherein said transparent dielectric films are formed of a material selected from the group consisting of silicon nitride and aluminum nitride.

4. The method of claim 1, wherein said first transparent dielectric film has a thickness of no less than 100 Å.

5. The method of claim 1, wherein said transparent dielectric films are formed by reactive sputtering of either Si (silicon) or Al (aluminum) in $N_2$ (nitrogen) gas; and wherein said transparent dielectric films each have a thickness of no less than 100 Å.

6. The method of claim 1, wherein said first and second transparent dielectric films are formed of a material selected from the group consisting of silicon nitride and aluminum nitride; and wherein said first and second transparent dielectric films each have a thickness of no less than 100 Å.

7. The method of claim 1, further including the step of forming the first dielectric film on said substrate prior to forming said film of recording medium to further preclude oxygen contamination of said recording medium by said substrate;

wherein said transparent dielectric films have a thickness of no less than 100 Å; and wherein said transparent dielectric films are formed of a material selected from the group consisting of silicon nitride and aluminum nitride.

8. A method of making an oxidation resistant magneto-optic memory device with enhanced stability of coercive force and information recording characteristics comprising the steps of:

providing a substrate for supporting a film of magneto-optic recording medium;

forming a first dielectric film which itself is free of oxygen on said substrate;

forming a film of rare earth-transition metal amorphous alloy recording medium on said first dielectric film;

forming a second transparent dielectric film which itself is free of oxygen on said film of recording medium; and forming a reflective film on said second dielectric film;

thereby precluding selective oxidation of the rare earth portion of said recording medium.

9. The method of claim 8, wherein said first dielectric film is formed by reactive sputtering of either Si (silicon) or Al (aluminum) in $N_2$ (nitrogen) gas.

10. The method of claim 8, wherein said first dielectric film is formed of a material selected from the group consisting of silicon nitride and aluminum nitride.

11. The method of claim 8, wherein said reflective film is formed of a material selected from the group consisting of aluminum, silver, gold, copper, stainless steel, titanium nitride, titanium, and nickel.

12. The method of claim 8, wherein said first dielectric film is formed by reactive sputtering of aluminum in nitrogen gas, and said reflective film is formed of a material selected from the group consisting of titanium nitride and titanium.

13. The method of claim 8, wherein said first dielectric film is formed of aluminum nitride, and said reflective film is formed of a material selected from the group consisting of titanium nitride and titanium.

14. The method of claim 8, wherein said first dielectric film is formed by reactive sputtering of aluminum in nitrogen gas, and said reflective film is formed of stainless steel.

15. The method of claim 8, wherein said first dielectric film is formed of aluminum nitride, and said reflective film is formed of stainless steel.

16. The method of claim 8, wherein said first dielectric film is formed by reactive sputtering of Si (silicon) or Al (aluminum) in $N_2$ (nitrogen) gas, and wherein said first dielectric film has a thickness of no less than 100 Å.

17. The method of claim 8, wherein said first dielectric film is formed of a material selected from the group consisting of silicon nitride or aluminum nitride, and wherein said first dielectric film has a thickness of no less than 100 Å.

18. A method of making an oxidation resistant magneto-optic memory device with enhanced stability of coercive force and information recording characteristics comprising the steps of:

providing a substrate for supporting a film of magneto-optic recording medium;

forming a dielectric film which itself is free of oxygen on said substrate;

forming a film of rare earth-transition metal amorphous alloy recording medium on said dielectric film; and forming a reflective film on said film of rare earth/transition metal alloy;

thereby precluding selective oxidation of the rare earth portion of said recording medium.

19. The method of claim 18, wherein said dielectric film is independently formed by reactive sputtering of either Si (silicon) or Al (aluminum) in $N_2$ (nitrogen) gas.

20. The method of claim 18, wherein said dielectric film is formed by reactive sputtering of silicon in nitrogen gas.

21. The method of claim 18, wherein said dielectric film is formed by reactive sputtering of aluminum in nitrogen gas.

22. The method of claim 18, wherein said dielectric film is formed of silicon nitride.

23. The method of claim 18, wherein said dielectric film is formed of aluminum nitride.

24. The method of claim 8 or 18, further comprising the step of covering said reflective film with a protective film comprising a material selected from the group consisting of Ti, Mg, a rare earth metal, and an alloy of a rare earth metal and a transition metal which inhibits oxygen from entering the device.

25. The method of claim 24, wherein said protective film comprises a material selected from the group consisting of Gd, Tb, Dy, Ho, Y, GdTbFe, TbDyFe, GdCo, and GdTbDyFe.

26. The method of claim 8 or 18, wherein said substrate comprises a material selected from the group consisting of glass, polycarbonate, acrylic, resin and epoxy resin.

27. The method of claim 8 or 18, wherein said magneto-optic recording film comprises a rare earth-transition metal alloy selected from the group consisting of GdTbFe, TbDyFe, GdTbDyFe, TbFe, GdFeCo and GdCo, or of said alloys with a content of Sn, Zn, Si, Bi or B.

28. A method of making an oxidation resistant magneto-optic memory device with enhanced stability of coercive force and information recording characteristics comprising the steps of:

providing a substrate for supporting a film of magneto-optic recording medium;

forming a film of rare earth-transition metal amorphous alloy recording medium on said substrate;

forming a transparent dielectric film which itself is free of oxygen on said film of recording medium; and forming a reflective film on said transparent dielectric film, said transparent dielectric film being formed of a material selected from the group consisting of $MgF_2$, ZnS, $CeF_3$ and $AlF_3 \cdot 3NaF$;

thereby precluding selective oxidation of the rare earth component of said recording medium.

29. A method of making an oxidation resistant magneto-optic memory device with enhanced stability of coercive force and information recording characteristics comprising the steps of:

providing a substrate for supporting a film of magneto-optic recording medium;

forming a first dielectric film which itself is free of oxygen on said substrate;

forming a film of rare earth-transition metal amorphous alloy recording medium on said first oxygen free dielectric film; and forming a second transparent dielectric film which itself is free of oxygen on said film of recording medium, said first and second transparent dielectric films being formed of a material selected from the group consisting of $MgF_2$, ZnS, $CeF_3$ and $AlF_3 \cdot 3NaF$ and wherein said first transparent dielectric film has a thickness of no less than 100 Å;

thereby precluding selective oxidation of the rare earth portion of said recording medium.

30. A method of making an oxidation resistant magneto-optic memory device with enhanced stability of coercive force and information recording characteristics comprising the steps of:

providing a substrate for supporting a film of magneto-optic recording medium;

forming a first dielectric film which itself is free of oxygen on said substrate;

forming a film of rare earth-transition metal amorphous alloy recording medium on said first dielectric film; and forming a second transparent dielectric film which itself is free of oxygen on said film of recording medium, said first and second transparent dielectric films being formed of a material selected from the group consisting of $MgF_2$, ZnS, $CeF_3$ and $AlF_3 \cdot 3NaF$;

thereby precluding selective oxidation of the rare earth portion of said recording medium.

31. A method of making an oxidation resistant magneto-optic memory device with enhanced stability of coercive force and information recording characteristics comprising the steps of:

providing a substrate for supporting a film of magneto-optic recording medium;

forming a film of rare earth-transition metal amorphous alloy recording medium on said substrate; and forming a transparent dielectric film which itself is free of oxygen on said film of recording medium, said transparent dielectric film being formed of a material selected from the group consisting of $MgF_2$, ZnS, $CeF_3$ and $AlF_3 \cdot 3NaF$ and wherein said transparent dielectric film has a thickness of no less than 100 Å;

thereby precluding selective oxidation of the rare earth portion of said recording medium.

32. A method of making an oxidation resistant magneto-optical memory device with enhanced stability of coercive force and information recording characteristics comprising the steps of:

providing a substrate for supporting a film of magneto-optic recording medium;

forming a first transparent dielectric film which itself is free of oxygen on said substrate;

forming a film of rare earth-transition metal amorphous alloy recording medium on said first transparent dielectric film; and forming a second transparent dielectric film which itself is free of oxygen on said film of recording medium;

thereby precluding the selective oxidation of the rare earth component of said recording medium.

33. The method of claim 1, 18, or 28, wherein each said dielectric film is dielectric films are formed of AlN of a thickness of from 400 to 500 Å.

34. A method of making an oxidation resistant magneto-optical memory device with enhanced stability of coercive force and information recording characteristics comprising the steps of:

forming a rare earth/transition metal alloy recording layer; and forming an oxygen free barrier in surface contact with a surface of said rare earth/transition metal alloy otherwise exposed to an oxygen containing material for preventing selective oxidation of a rare earth component of the rare earth/transition metal alloy.

35. A method of stabilizing and enhancing the shelf-life of a magneto-optic device having a magneto-optic layer formed of a rare earth/transition metal alloy by precluding selective oxidation of the rare earth portion of said alloy from an adjacent layer of material and a resulting deterioration of the coercive force of said alloy, comprising the steps of:

forming said adjacent layer of material;

forming a protective layer of transparent dielectric material having no oxygen content over said adjacent layer; and forming said magneto-optic layer over said protective layer while maintaining said protective layer between said adjacent and magneto-optic layers.

36. A method of stabilizing and enhancing the shelf-life of a magneto-optic device having a magneto-optic layer formed of a rare earth/transition metal alloy by precluding selective oxidation of the rare earth portion of said alloy from an adjacent layer of material and a resulting deterioration of the coercive force of said alloy, comprising the steps of:

forming a first adjacent layer of transparent material as a substrate;

forming a first protective layer of transparent dielectric material over said substrate;

forming said magneto-optic layer over said first protective layer while maintaining said first protective layer between said substrate and magneto optic layers;

forming a second protective layer of transparent dielectric material having no oxygen content over said magneto-optic layer; and forming a second adjacent layer of reflective material over said second protective layer while maintaining said second protective layer between said magneto-optic and reflective layers.

37. A method of stabilizing and enhancing the shelf-life of a magneto-optic memory device having a magneto-optic layer formed of rare earth/transition metal alloy, the alloy being subject to deterioration of coercive force, comprising the step of precluding selective oxidation of the rare earth portion of said alloy and the resulting deterioration of coercive force of said alloy.

38. The method of claim 37, wherein said step comprises coating said magneto-optic layer with a protective layer of transparent dielectric material which itself is free of oxygen.

39. A method of stabilizing and enhancing the shelf-life of a magneto-optic device having a magneto-optic layer formed of a rare earth/transition metal alloy by precluding selective oxidation of the rare earth portion of said alloy from an adjacent layer of material and a resulting deterioration of the coercive force of said alloy, comprising the steps of:

forming a first layer of transparent material as a substrate;

forming a first protective layer of transparent dielectric material over said substrate;

forming said magneto-optic layer over said first protective layer while maintaining said first protective layer between said substrate and magneto-optic layers;

forming a second protective layer of transparent dielectric material having no oxygen content over said magneto-optic layer; and forming a second adjacent layer of reflective material over said second protective layer while maintaining said second protective layer between said magneto-optic and reflective layers.

* * * * *

UNITED STATES PATENT AND TRADEMARK OFFICE
CERTIFICATE OF CORRECTION

PATENT NO. : 5,738,765
DATED : April 14, 1998
INVENTOR(S) : Kenji Ohta, et al.

It is certified that error appears in the above-indentified patent and that said Letters Patent is hereby corrected as shown below:

Column 10, line 37, second line of claim 33, change "dielectric film is is dielectric films are formed" to read --dielectric film is formed--.

Signed and Sealed this

Twenty-fifth Day of August, 1998

*Attest:*

BRUCE LEHMAN

*Attesting Officer*          *Commissioner of Patents and Trademarks*